(12) United States Patent
Kopel

(10) Patent No.: US 8,086,916 B2
(45) Date of Patent: Dec. 27, 2011

(54) SYSTEM AND METHOD FOR RUNNING TEST AND REDUNDANCY ANALYSIS IN PARALLEL

(75) Inventor: Kristopher Kopel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 186 days.

(21) Appl. No.: 12/490,657

(22) Filed: Jun. 24, 2009

(65) Prior Publication Data

US 2009/0265588 A1    Oct. 22, 2009

Related U.S. Application Data

(62) Division of application No. 11/739,599, filed on Apr. 24, 2007, now abandoned.

(51) Int. Cl.
    *G11C 29/00* (2006.01)
(52) U.S. Cl. .......................... 714/718; 714/711
(58) Field of Classification Search .................. None
    See application file for complete search history.

(56) References Cited

U.S. PATENT DOCUMENTS

| | | | | |
|---|---|---|---|---|
| 4,627,053 A | * | 12/1986 | Yamaki et al. | 714/711 |
| 4,782,487 A | * | 11/1988 | Smelser | 714/723 |
| 5,588,115 A | | 12/1996 | Augarten | |
| 5,657,075 A | | 8/1997 | Roessner | |
| 5,754,556 A | | 5/1998 | Ramseyer et al. | |
| 5,795,797 A | | 8/1998 | Chester et al. | |
| 5,841,783 A | | 11/1998 | Suzuki et al. | |
| 5,867,435 A | | 2/1999 | Ogino | |
| 5,914,964 A | | 6/1999 | Saito et al. | |
| 5,917,764 A | * | 6/1999 | Ohsawa et al. | 365/200 |
| 5,983,374 A | * | 11/1999 | Todome et al. | 714/718 |
| 5,985,677 A | | 11/1999 | Nishio et al. | |
| 6,103,991 A | | 8/2000 | Domae et al. | |
| 6,324,665 B1 | | 11/2001 | Fay | |
| 6,353,801 B1 | | 3/2002 | Sercu et al. | |
| 6,434,063 B1 | | 8/2002 | Nishio et al. | |
| 6,442,724 B1 | | 8/2002 | Augarten | |
| 6,459,292 B1 | * | 10/2002 | Oikawa et al. | 324/762.01 |
| 6,499,118 B1 | | 12/2002 | Michaelson | |
| 6,499,120 B1 | * | 12/2002 | Sommer | 714/723 |
| 6,590,182 B1 | | 7/2003 | Domae | |
| 6,594,788 B1 | | 7/2003 | Yasui | |

(Continued)

OTHER PUBLICATIONS

USPTO; Office Action dated Feb. 27, 2009, from related U.S. Appl. No. 11/739,599, filed Apr. 24, 2007.

(Continued)

*Primary Examiner* — Jeffrey A Gaffin
*Assistant Examiner* — Steve Nguyen
(74) *Attorney, Agent, or Firm* — Knobbe Martens Olson & Bear LLP

(57) ABSTRACT

A memory redundancy analyzing apparatus having a tester, a queue, and a redundancy analyzer is provided. The tester includes testing portions for different types of fails, and each of the testing portions performs multiple tests on the memory locations and outputs fail information for at least a part of the memory device. The queue stores the fail information. The redundancy analyzer processes the fails using the fail information and produces a plurality of repair solutions. The types of fails include must fails and sparse fails. The fail information is transmitted to the queue, and the fail information includes at least a part of the fail information for the entire memory device. The tester can operate asynchronously from the redundancy analyzer.

5 Claims, 6 Drawing Sheets

U.S. PATENT DOCUMENTS

| | | |
|---|---|---|
| 6,627,880 B2 | 9/2003 | Goodley et al. |
| 6,631,488 B1 | 10/2003 | Stambaugh et al. |
| 6,651,204 B1 | 11/2003 | Rajsuman et al. |
| 6,697,290 B2 | 2/2004 | Koss et al. |
| 6,710,590 B1 | 3/2004 | Markert et al. |
| 6,711,705 B1 | 3/2004 | Yasui |
| 6,714,466 B2 * | 3/2004 | Park et al. ............... 365/200 |
| 6,751,140 B2 | 6/2004 | Schmolz et al. |
| 6,804,141 B1 | 10/2004 | Rickes et al. |
| 6,840,428 B2 | 1/2005 | Wong et al. |
| 6,907,385 B2 * | 6/2005 | Yasui ............... 702/184 |
| 6,914,833 B2 | 7/2005 | Koss et al. |
| 7,047,454 B2 * | 5/2006 | Kaiser et al. ............... 714/710 |
| 7,257,753 B2 | 8/2007 | Sato |
| 7,389,453 B2 * | 6/2008 | Udell ............... 714/724 |
| 7,613,960 B2 * | 11/2009 | Okawa et al. ............... 714/710 |

OTHER PUBLICATIONS

USPTO; Final Office Action dated Jun. 3, 2009, from related U.S. Appl. No. 11/739,599, filed Apr. 24, 2007.

* cited by examiner

SYSTEM AND METHOD FOR RUNNING TEST AND REDUNDANCY ANALYSIS IN PARALLEL

CROSS-REFERENCE TO RELATED APPLICATION

This application is a divisional application of U.S. application Ser. No. 11/739,599, filed Apr. 24, 2007, the entirety of which is incorporated by reference herein.

BACKGROUND

1. Field of the Invention

One embodiment generally relates to test of memory devices. In particular, one embodiment relates to systems and methods of repairing memory devices.

2. Description of the Related Art

Semiconductor memory devices can be found in a wide variety of electronics devices. Modern memory devices are relatively large in size and relatively inexpensive. A memory device typically includes at least one array of memory cells arranged in rows and columns. In a relatively large array, it can be expected that some cells will not be usable. Accordingly, redundant rows and columns exist to repair the defective cells via redundancy analysis. Tests are performed on memory devices to identify the cells that need to be replaced. For relatively large arrays, these tests comprising test patterns can be time-consuming and relatively expensive. For example, many test patterns may be run to test for gross failures, and to test for margin such as voltage, speed, and the like.

FIG. 1 is a flowchart illustrating an example of a conventional test and redundancy analysis. For example, the process can be performed by Automated Test Equipment (ATE).

To be more specific, the process starts in step S910. In step S920, a first test pattern is chosen and applied to the device under test (DUT). The test results from step S920, i.e., the information on the failed memory locations (the fails), are collected into a fail capture memory, which is a storage device to store the information on the fails. The fail information from test patterns includes information on the fails such as internal addresses. The solution or solution information from redundancy analysis includes information on which redundant rows or columns would be activated to replace and repair the fails. In step S930, the test results are copied for a redundancy analyzer so that a test pattern and a redundancy analysis for an immediately prior test pattern can be run in parallel. In step S940, Threads 1 and 2 are spawned, and run in parallel, in which the redundancy analyzer starts to process the test results obtained in the step S920 or S960 and stored in the fail capture memory. While the redundancy analyzer processes the fails in step S950, testing with a next test pattern is performed on the DUT in S960 along Thread 1. In the step S950, the redundancy analysis for both the must fail and sparse fails is performed. The redundancy analysis of S950 can take more time or less time to complete than the test pattern S960. When the step S970 waits for completion of the step S950, the test as a whole runs slower than the speed at which the ATE can perform the test patterns, which adds time and cost to the DUT. For example, in the prior art, a second test with "next pattern" S960 is on hold waiting S970 for the redundancy analysis S950 obtained from the first test with "1st pattern" S920 is done. Once the step S950 is done, then the process can return to S930 via S970 to run further test patterns and redundancy analysis, or finishes the process.

BRIEF DESCRIPTION OF THE DRAWINGS

These drawings and the associated description herein are provided to illustrate specific embodiments and are not intended to be limiting.

DETAILED DESCRIPTION OF EMBODIMENTS

Figure 2:
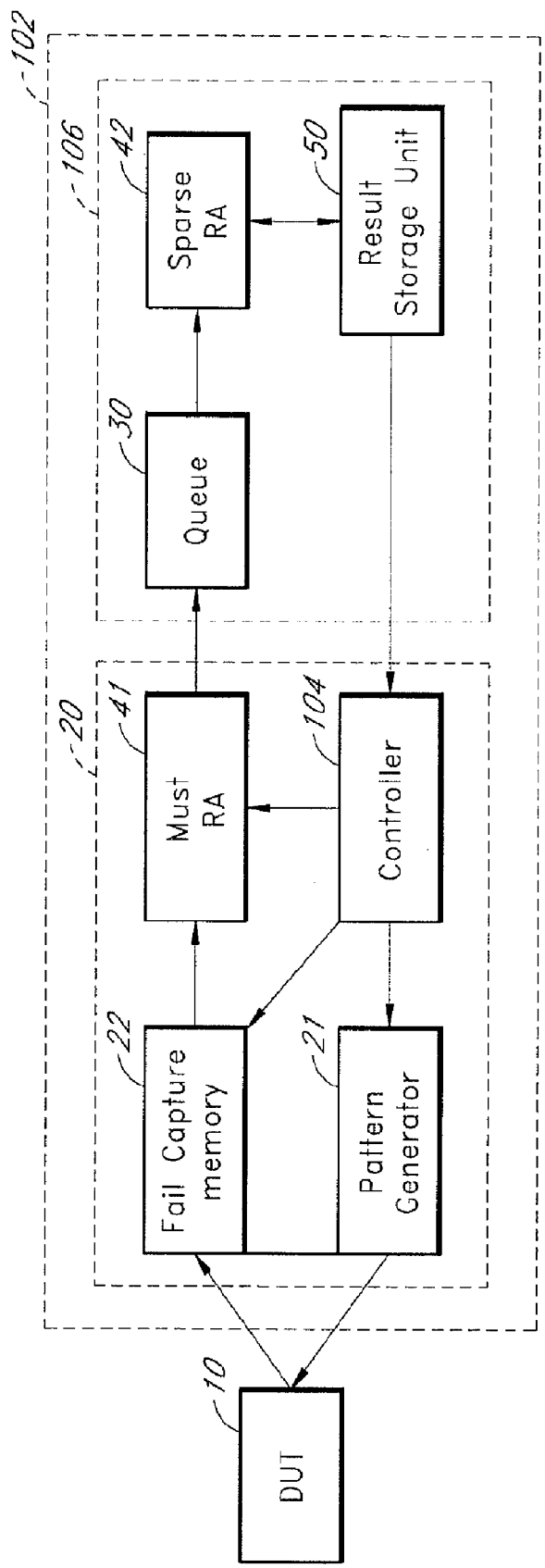
FIG. 2 is a schematic block diagram of an apparatus for repairing a memory device.

FIG. 2 shows a schematic block diagram illustrating an apparatus 102 for testing and/or repairing a memory device under test (DUT) 10. The memory device can include any memory device such as DRAM, SDRAM, SRAM, MRAM, FRAM, Flash, EEPROM, PCRAM, etc.

The apparatus 102 comprises a tester 20, a fail capture memory 22, a must redundancy analyzer 41, a queue 30, a sparse redundancy analyzer 42, a result storage unit 50, a pattern generator 21, and a controller 104. The tester 20 performs tests (test patterns) on the DUT 10 to determine memory locations that fail. The "fails" are collected and stored temporarily at the fail capture memory 22 in the tester 20. The must redundancy analyzer 41 and the sparse redundancy analyzer 42 process the information on the fails to produce a solution to repair the problematic memory locations. The controller 104 is configured to control the pattern generator 21, the fail capture memory 22, and the must redundancy analyzer 41 in the tester 20. The pattern generator 21 generates multiple test patterns to test the DUT 10 with.

Most types of memory devices, such as DRAM, have row and column repairs. However, the illustrated test process is applicable to other types of repair such as blocks (single repairs that can replace multiple rows or columns), two dimensional plane repairs for a three dimensional array, or the like.

There can be a plurality of testers 20 in a system. In one embodiment, each of the testers 20 can communicate with a sparse redundancy analyzer as indicated by a dotted box 106 including a queue 30, a sparse redundancy analyzer 42, and a result storage unit 50 as shown in FIG. 2. In another embodiment, the dotted box portion 106 can be shared by one or more the testers 20. In the illustrated embodiment, analysis of must fails is performed by the must redundancy analyzer 41 and sparse fails by the sparse redundancy analyzer 42. Fails are either must fails or sparse fails, and these concepts are explained below.

Repairing of a memory device and manipulating a solution are explained with reference to FIGS. 3A and 3B.

Figure 3A:
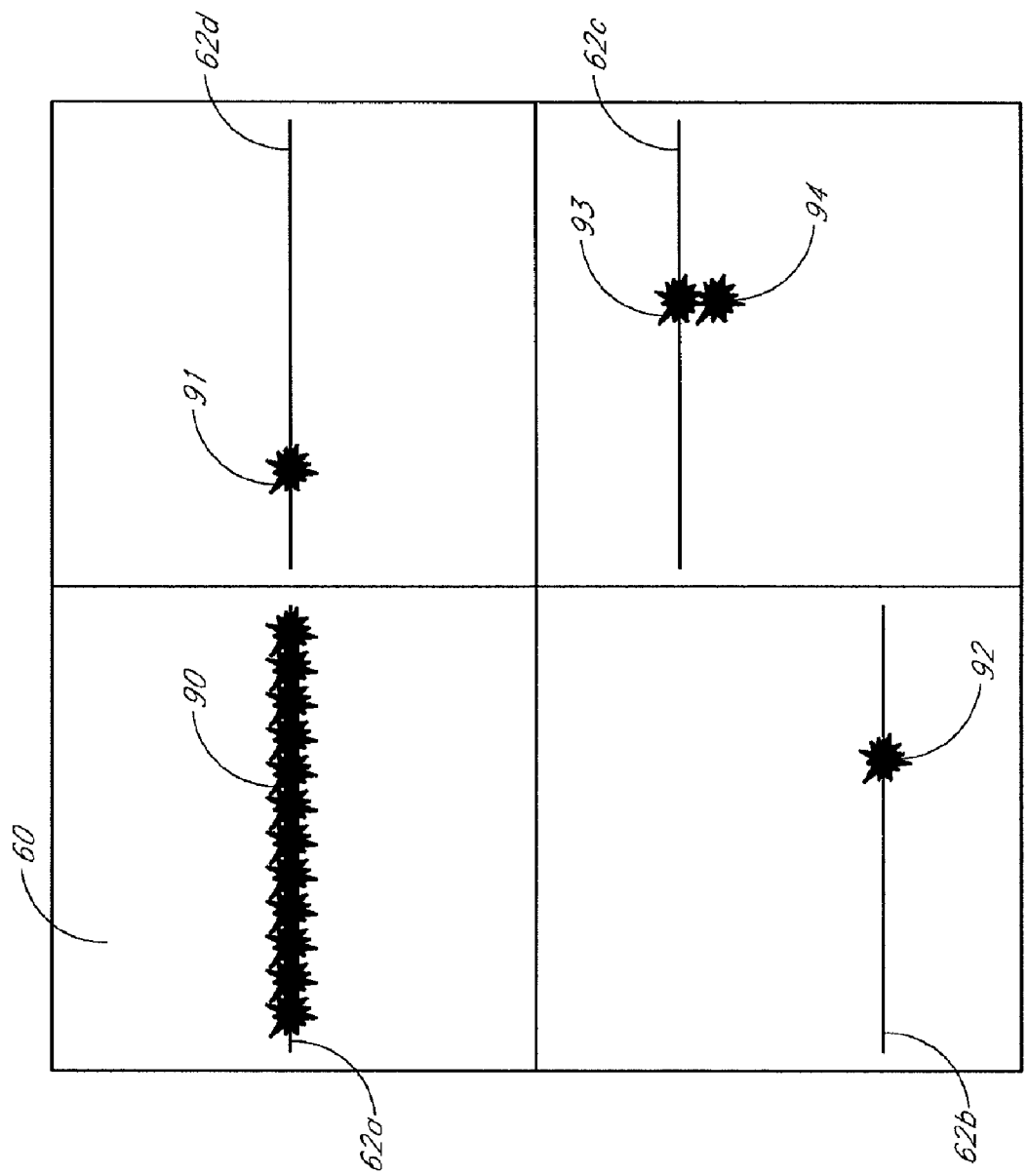
FIG. 3A is a diagram illustrating fails and repair for an array of a memory device.
Figure 3B:
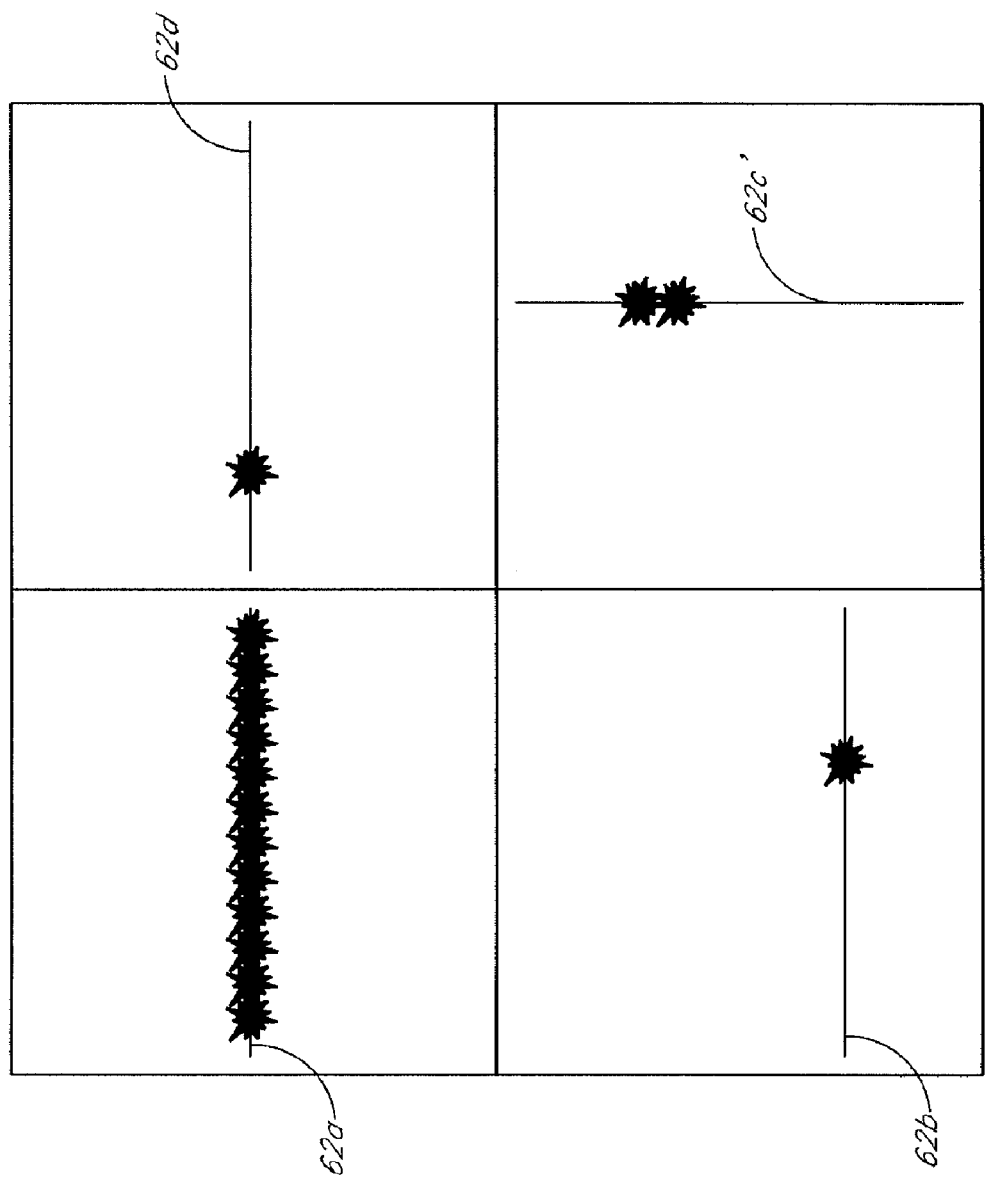
FIG. 3B is a diagram illustrating manipulating a solution for the repair of FIG. 3A.

A must fail 62a in FIG. 3B corresponds to multiple single bit fails that should be repaired by a single element. A sparse fail is a single bit fail that is not part of a must fail. The other fails in FIG. 3B can be sparse fails. A single element can repair one or more sparse fails.

To optimize the solution to repair of the fails 91, the solution information for the fail information can be manipulated in the sparse redundancy analyzer 42 (FIG. 2) using sets of rules. The must fail 90 and sparse fails 91, 92, 93, 94 can be taken and handled using the sets of rules. A sparse fail is typically an isolated single bit fail. A common type of fail is single bit fail 91, 92, 93, 94 as shown in FIGS. 3A and 3B. Another type of fail is a "must" fail such as a line fail, which is a collection of single bit fails aligned along a row or a column 62a. In the illustrated example, the must fail 90 can be repaired with a row redundant repair 62a.

The fail information from the tester 20 can be placed into a data structure using the sets of rules. If necessary, the fails can be rearranged by moving fails from one solution to another or combining two or more solutions. For example, two solutions, each of which corresponds to a sparse fail, sharing a single row or column can be coalesced into one solution. Sometimes a solution having a sparse fail can be absorbed into another solution having a must fail in it if two solutions share a single row or column.

FIGS. 3A and 3B illustrate coalescing two solutions into one solution. The top sparse fail 93 in the lower right quadrant was in a repair solution 62c, but is moved to a new repair solution 62c' in FIG. 3B as a result of considering in the bottom sparse fail 94. Alternatively, all the fails 90, 91, 92, 93, and 94 can be collected into one solution and prepared to be handled by a one-shot analysis.

Returning now to FIG. 2, the queue 30 is provided in the data flow between the must redundancy analyzer 41 and the sparse redundancy analyzer 42. The fail information from the tester 20 is processed for the must fails by the must redundancy analyzer 41 first, and the solutions from the must redundancy analyzer 41 and the remaining unprocessed fail information are placed into the queue 30. Then, the sparse redundancy analyzer 42 processes the sparse fails for each test pattern in parallel with other test patterns. In one embodiment, the tester 20 does not have to wait for the must redundancy analyzer 41 and the sparse redundancy analyzer 42 to finish between test patterns, and can add new test results to the queue 30. In one embodiment, multiple test patterns can run following the analysis of a single test pattern with no loss to the test origin of fails. The parallel processing of the tester 20 and the redundancy analyzer 42 is made possible due to the introduction of the queue 30.

The queue 30 can hold must fail information, solutions for the must fails received from the must redundancy analyzer 41, and the unprocessed sparse fail information. In one embodiment, the queue 30 is implemented in software. The queue 30 permits separate processes, e.g., threads, to run in parallel. The must redundancy analyzer 41 can be integrated with the tester 20. The queue 30 can receive the sparse fail information directly from the tester 20.

The solution information for previous test patterns can be stored in the result storage unit 50 (FIG. 2). The sparse redundancy analyzer 42 can look up this solution information stored in the result storage unit in performing multiple test patterns on the DUT 10. The tester 20 can also evaluate the stored solutions. This will be described later in reference to FIG. 4.

Usually, multiple test patterns are applied on the same DUT 10. Some of the fails can not be detected by a simple test pattern, but can be detected by a more vigorous and deep test pattern. When multiple test patterns are performed on the single DUT 10, a first group of fails can be detected by one test pattern, and a second group of fails can be detected by another test pattern. The second group can include the first group. In one embodiment, the sparse redundancy analyzer 42 looks up the solution information stored in the result storage unit for the solution for the first group of fails, and processes the second group of fails for the solution. This reuse of the previous results is beneficial because the number of newly detected fails in the second group typically decreases as the test progresses. For example, the number of fails detected in the first test pattern can be tens of thousands. In a second test pattern, the number of newly detected fails can drop to hundreds.

Each of the must redundancy analyzer 41, the queue 30, and the sparse redundancy analyzer 42 can comprise a package of control software.

By introducing the queue 30, the analysis of the fail information can be offloaded into a parallel evaluation space. This can facilitate parallel processing of testing and repairing. The introduction of the queue 30 allows for asynchronous parallel processing of the test and the repair. Multiple test patterns can be run in parallel with a previous test pattern's repair analysis. There is no waiting between the test patterns for repair analysis.

In one embodiment, by manipulating the fail information and the solution information as in compressing the fail information and the solution information, the fails of the DUT 10 can be repaired in a way that reduces waste of the redundant rows and columns, thus leaving more elements available for repair during later test steps.

Since the tester 20 and the redundancy analyzer 42 can work in parallel and due to the compression of the fail data, the tester 20 uses less memory space in the fail capture memory 22. The fail capture memory 22 does not have to hold the test results for the entire DUT 10. The DUT 10 can be tested in parts of a predetermined size and addresses adjusted (if necessary) when they are uploaded to the must redundancy analyzer 41 and the sparse redundancy analyzer 42.

A first repair solution for a sparse fail can be changed to a second repair solution to optimize the single repair solution and to reduce wasting the memory locations of the redundant rows and columns.

Test patterns can comprise, for example, a nominal voltage test, a high voltage margin test, and a low voltage margin test.

The queue 30 can hold the fail information from the tester 20 and the solution information from the first redundancy analyzer 41. The result storage unit 50 can hold solutions from the sparse redundancy analyzer 142. Furthermore, the apparatus 102 can comprise two queues, e.g., a fail queue and a result queue, as shown in FIG. 4.

Figure 4:
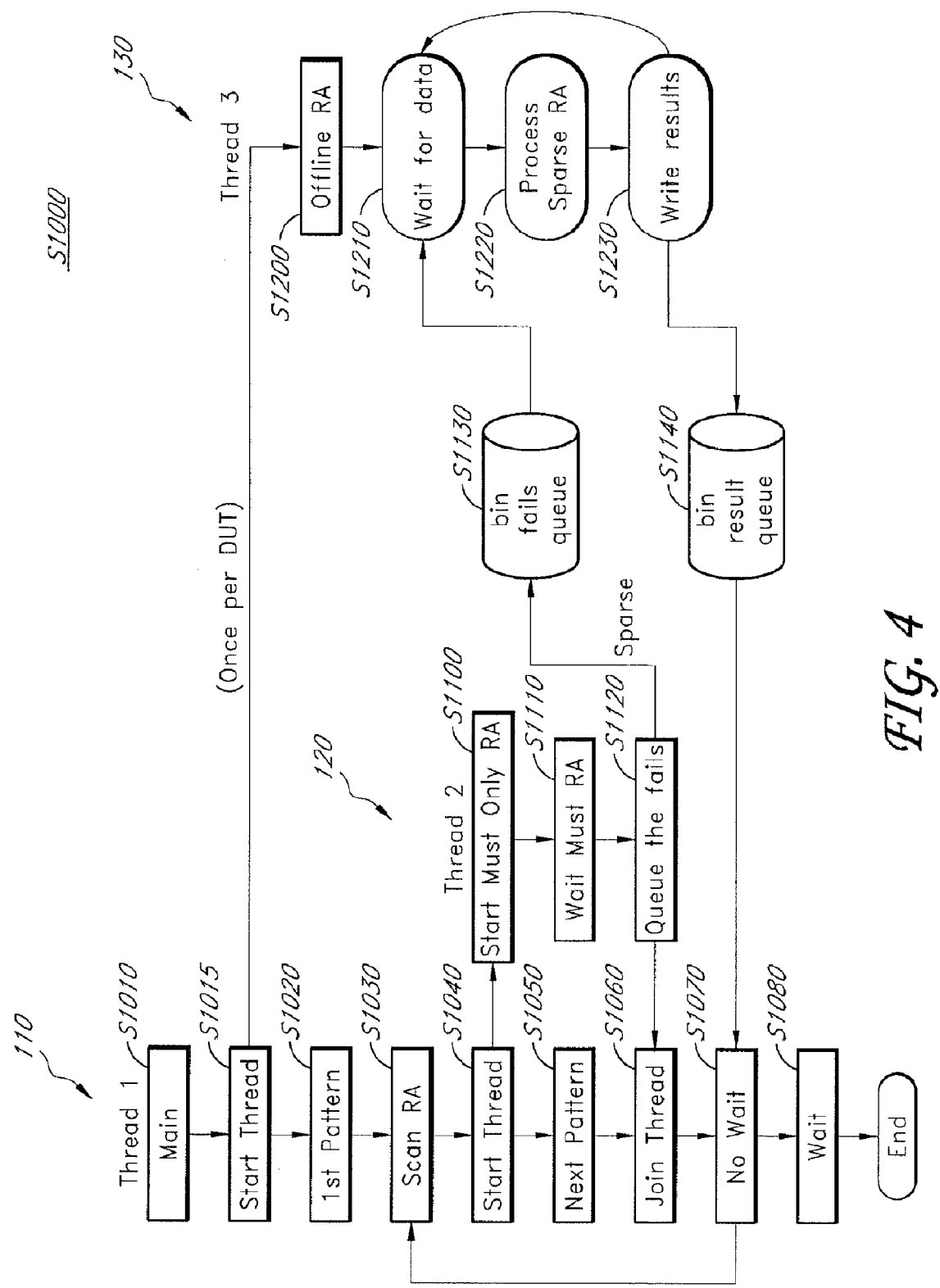
FIG. 4 is a flowchart illustrating a test process according to an embodiment.

FIG. 4 is a flowchart illustrating a test process having 3 threads (processes) according to an embodiment. In one embodiment, the portions of processes can be performed by a general purpose computer. The processes can be performed in parallel in the three independent threads, i.e., Thread 1 110, Thread 2 120, and Thread 3 130 in FIG. 4. The test patterns are generally performed in Thread 1, the redundancy analysis on the must fails is performed in Thread 2, and the redundancy analysis on the sparse fails is performed in Thread 3. In the illustrated embodiment, the spawning of Thread 2 occurs for every test pattern of Thread 1, and the spawning of Thread 3 occurs once per DUT. A thread does not have to wait for another thread to complete. Efficient parallel processing is made possible by the processes of queuing the fails S1130 and the results S1140. In one embodiment, queuing is performed in software.

In practice, test patterns that come early in the testflow typically have more failures, and therefore take more time to process. For example, the sparse redundancy analyzer (Thread 3) typically falls behind test patterns (Thread 1) early in the test cycle due to the number of failures to analyze. Since the test patterns and redundancy analysis can be processed in parallel, however, the testflow does not have to get stalled. This typically allows the sparse redundancy analyzer to catch up later in the testflow when fewer additional fails are processed.

In the illustrated embodiment of a testing process as shown in FIG. 4, the whole process starts at S1010, from which the threads are spawned directly or indirectly. Threads 1 and 3 are started at S1015. A test is performed using the first test pattern in S1020. The test results are copied for later analysis by the redundancy analysis process in S1030 and Thread 2 starts in S1040. The tests using second and subsequent test patterns are performed at S1050. In one embodiment, the step S1030 is optional.

Using the test results, the must redundancy analysis is performed in S1100, and the sparse redundancy analysis is performed in S1220 to be described later. The must redundancy analysis is spawned and initiated from the Thread 1 at S1040. In an alternative embodiment, the must analysis process is not threaded, and steps S1100, S1110, and S1120 are performed in line at step S1040. The must redundancy analysis results from S1100 is received at S1110 and then queued in S1130 by S1120. A must redundancy analysis process separates the must fails from sparse fails in a first queue for parallel analysis with a sparse redundancy analysis process (S1220). In one embodiment, the must redundancy analysis process can be optional. That is, the sparse redundancy analyzer can process all the fails as sparse fails and produce repair solutions.

Figure 1:
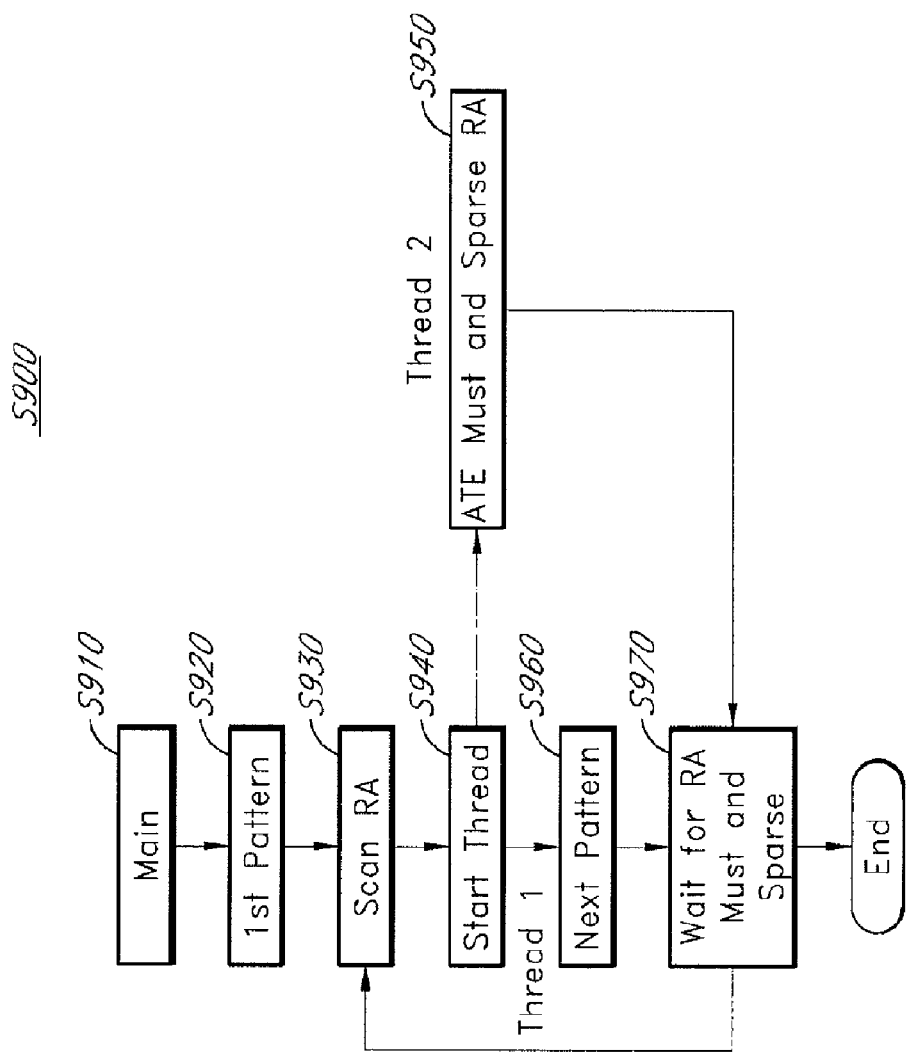
FIG. 1 is a flowchart illustrating a conventional redundancy analysis.

The redundancy analysis of Thread 3 for a particular test pattern can be done in the background after the must redundancy analysis process of Thread 2 for the particular test pattern by the must redundancy analyzer is complete. The test pattern process (Thread 1) should wait for the must redundancy analyzer to finish the must screening for a particular test pattern before continuing (S1060), but that task should finish relatively more quickly than with the conventional system of FIG. 1 since it is doing far less work by delegating the analysis on the sparse fails to the sparse redundancy analyzer (Thread 3). For example, the tester can proceed through several test patterns while the sparse redundancy analysis process is running for an earlier test pattern. The bin fails queue (S1130) holds the data from each of these test patterns. The parallel redundancy analysis S1200 waits S1210 for the fail information from S1130, processes the sparse fails at S1220, and places its results S1230 in a second queue (S1140) which the test process checks between test patterns (S1070) to determine if the flow can abort to S1080 if the DUT has been rejected. The testflow does not need to wait for solutions until the test patterns have been completed (S1080).

A repair solution can be stored in the sparse redundancy analyzer 42. The manipulation such as optimization of the repair solution can occur also in the sparse redundancy analyzer 42.

Due to the decoupling of the sparse redundancy analyzer 42 from the must redundancy analyzer 41, there is no need for the repair solution to be cleared between every test pattern. For the repair solutions from a previous test pattern can be queued into the result storage unit 50. It can be burdensome if a redundancy analysis should be started from a clean slate at every test pattern.

One embodiment is an apparatus for efficient test of a memory device comprising a main array and a plurality of redundant row and columns, each of which have a plurality of memory locations, wherein the apparatus includes: a tester configured to perform multiple test patterns on the plurality of memory locations and to generate fail information for at least a part of the memory locations; a queue configured to receive the sparse fail information from the tester; and a redundancy analyzer configured to process at least part of the plurality of fails received from the queue and configured to generate corresponding repair solutions; wherein the tester is configured to proceed with a next test pattern before the redundancy analyzer processing the fail information from a previous test pattern.

Figure 5:
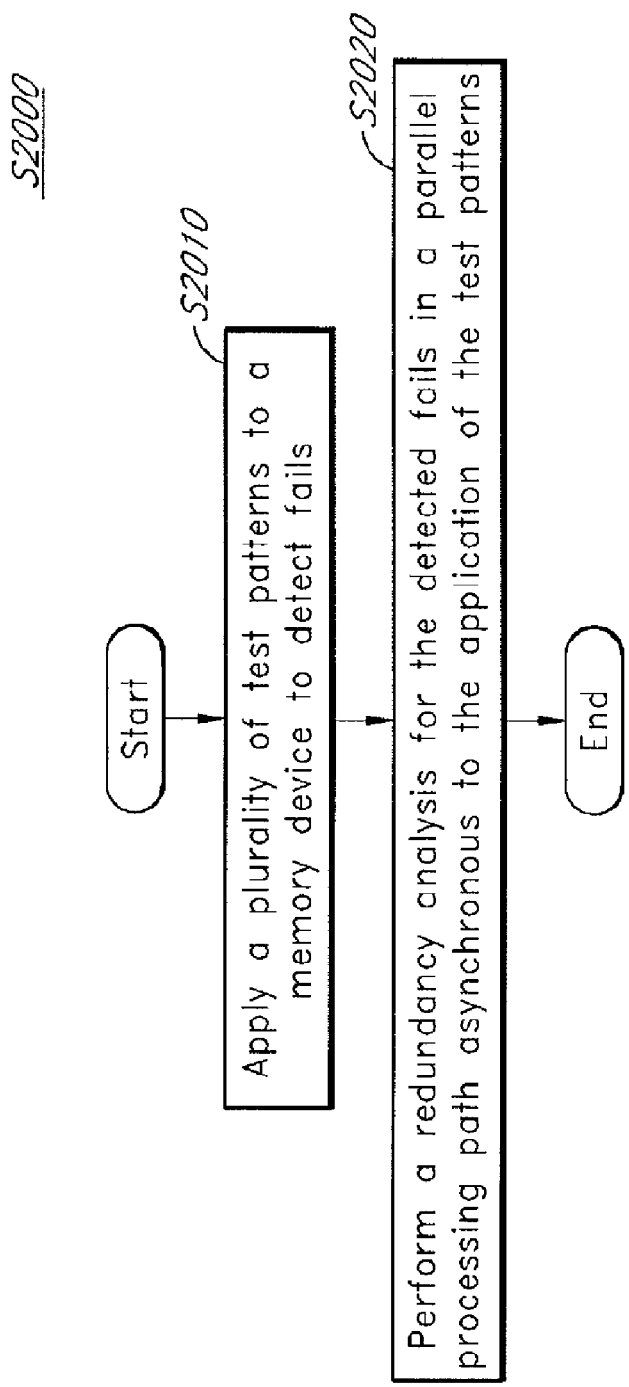
FIG. 5 is a flowchart illustrating a test process according to another embodiment.

FIG. 5 is a flowchart illustrating a test process according to another embodiment. One embodiment is a method of repairing a memory device, wherein the method includes: applying a plurality of test patterns to a memory device to detect fails (S2010); and performing a redundancy analysis for the detected fails in a parallel processing path asynchronous to the application of the test patterns (S2020).

The method can further comprise: storing the fails from test patterns for access by the redundancy analysis process; and initiating the third test pattern before redundancy analysis for the first test pattern is complete. The method can still further comprise spawning a first thread for processing the fails from the test pattern and generates repair solutions. The process is finished when all the test patterns are performed and all the detected fails are processed.

Some redundancy analyzers completely re-evaluate the repair solution after any additional test pattern. Alternatively, the process of evaluation can remove the need for a complete evaluation, leveraging required repairs defined earlier and evaluating the solutions required from newly added fails.

The method can further comprise initiating a subsequent redundancy analysis for processing a plurality of sparse fails after receiving fail information of the last of the multiple test patterns. The method can further comprise maintaining and retrieving at least part of fails from at least part of the multiple test patterns and solutions from the redundancy analysis. Receiving failure information, initiating redundancy analysis, initiating a subsequent test pattern, and initiating a subsequent redundancy analysis can be performed substantially concurrently through maintaining and retrieving from the queue.

In an embodiment, the fail information for each test pattern can be compressed. The fails are accumulated during analysis rather than before analysis, and can be compressed based on a repair architecture rather than accumulating a full bitmap for the entire DUT 10. This allows for an algorithm to reuse previous analysis result as basis for current test pattern, and yet still allows for manipulation of previous result.

For example, if five fails were located in a previous analysis and six fails in a current analysis, and if five of the six fails are the same as in the previous analysis, the must redundancy analyzer 41 and the sparse redundancy analyzer 42 do not have to analyze all six fails in the current analysis. The must redundancy analyzer 41 and the sparse redundancy analyzer 42 can retrieve the previous analysis result from a result storage unit 50 (FIG. 2) and perform an analysis on the single newly found fail.

Various embodiments have been described above. Although described with reference to these specific embodiments, the descriptions are intended to be illustrative and are not intended to be limiting. Various modifications and applications can occur to those skilled in the art without departing from the true spirit and scope of the invention as defined in the appended claims.

I claim:

1. A method of repairing a memory device, the method comprising:
    applying a plurality of test patterns to a memory device to detect fails; and performing a redundancy analysis for the detected fails in a parallel process asynchronous to the process of applying the test patterns, wherein the process of applying the test patterns initially operates faster than the parallel process of performing redundancy analysis such that fails from the test patterns are queued in a queue, wherein the parallel process of performing redundancy analysis retrieves the fails from the queue such that the parallel process of redundancy analysis can catch up to the process of applying the test patterns later in a testflow.

2. The method of claim 1, wherein the plurality of test patterns comprise at least a first test pattern, a second test pattern, and a third test pattern, wherein the first test pattern is applied earlier in time than the second test pattern, and wherein the second test pattern is applied earlier in time than the third test pattern, further comprising: storing the fails from test patterns for access by the redundancy analysis process; and initiating the third test pattern before redundancy analysis for the first test pattern is complete.

3. The method of claim 2, further comprising spawning a first thread for processing the fails from the test pattern and generating repair solutions, wherein the repair solutions comprise a plurality of must repair solutions.

4. The method of claim 3, further comprising spawning a second thread for processing the fails from the test patterns and generating repair solutions, wherein the repair solutions comprise a plurality of sparse repair solutions.

5. The method of claim 2, wherein the number of detected fails from each of the plurality of patterns diminishes as the number of the applied test patterns increases.

* * * * *